(12) United States Patent
Yu et al.

(10) Patent No.: US 11,164,962 B2
(45) Date of Patent: Nov. 2, 2021

(54) BIPOLAR TRANSISTOR AND METHOD FOR FORMING THE SAME

(71) Applicant: WIN SEMICONDUCTORS CORP., Taoyuan (TW)

(72) Inventors: Chien-Rong Yu, Taoyuan (TW); Shu-Hsiao Tsai, Taoyuan (TW); Jui-Pin Chiu, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 2 days.

(21) Appl. No.: 16/734,476

(22) Filed: Jan. 6, 2020

(65) Prior Publication Data

US 2021/0210626 A1 Jul. 8, 2021

(51) Int. Cl.
| | |
|---|---|
| *H01L 29/737* | (2006.01) |
| *H01L 29/66* | (2006.01) |
| *H01L 29/417* | (2006.01) |
| *H01L 29/08* | (2006.01) |

(52) U.S. Cl.
CPC ........ *H01L 29/737* (2013.01); *H01L 29/0821* (2013.01); *H01L 29/41708* (2013.01); *H01L 29/66242* (2013.01)

(58) Field of Classification Search
CPC .............. H01L 29/737; H01L 29/0821; H01L 29/41708; H01L 29/66242
See application file for complete search history.

(56) References Cited

U.S. PATENT DOCUMENTS

| | | | |
|---|---|---|---|
| 10,490,639 B2 | 11/2019 | Tao et al. | |
| 2011/0316050 A1* | 12/2011 | Bito | ..................... H01L 27/0605 257/197 |
| 2019/0305094 A1* | 10/2019 | Tao | ........................ H01L 29/205 |

* cited by examiner

*Primary Examiner* — Syed I Gheyas
(74) *Attorney, Agent, or Firm* — McClure, Qualey & Rodack, LLP (57) ABSTRACT

A bipolar transistor includes an upper sub-collector layer, a collector layer, a base layer, an emitter layer, and a collector electrode. The collector layer is disposed on the upper sub-collector layer. The base layer is disposed on the collector layer. An emitter layer is disposed on the base layer. The collector electrode is disposed directly on a sidewall of the upper sub-collector layer.

20 Claims, 5 Drawing Sheets

BIPOLAR TRANSISTOR AND METHOD FOR FORMING THE SAME

BACKGROUND

Technical Field

The disclosure relates to a semiconductor structure, and more particularly to a bipolar transistor and a method for forming a bipolar transistor.

Description of the Related Art

A heterojunction bipolar transistor (HBT) is a bipolar junction transistor with two different materials with different energy band-gaps. Heterojunction bipolar transistors are widely used in the industry due to their many advantages, which include a low base resistance, a high cut-off frequency, a high efficiency, more design flexibility, and a low cost.

The collector resistance of HBT may impact the maximum operation frequency and the device performance. The collector resistance of HBT includes external sub-collector resistance, internal sub-collector resistance, and access resistance. In order to achieve high efficiency, high output power, and high linearity, the overall collector resistance of an HBT needs to be reduced further.

Although existing bipolar transistors have generally been adequate for their intended purposes, they have not been entirely satisfactory in all respects, and need to be improved. This is especially true of the reduction of the collector resistance.

BRIEF SUMMARY

The present disclosure provides a bipolar transistor including an upper sub-collector layer, a collector layer, a base layer, an emitter layer, and a collector electrode. The collector layer is disposed on the upper sub-collector layer. The base layer is disposed on the collector layer. An emitter layer is disposed on the base layer. The collector electrode is disposed directly on a sidewall of the upper sub-collector layer.

The present disclosure also provides a bipolar transistor including a sub-collector layer, a collector layer, a base layer, an emitter layer, and a collector electrode. The sub-collector layer is disposed on a substrate. The collector layer is disposed on the sub-collector layer. The base layer is disposed on the collector layer. The emitter layer is disposed on the base layer. The collector electrode is disposed on a sidewall of the sub-collector layer. An ohmic contact is formed between the collector electrode and the sub-collector layer.

The present disclosure further provides a method for forming a bipolar transistor. The method includes forming a bottom sub-collector layer on a substrate. The method also includes forming an upper sub-collector layer on the bottom sub-collector layer. A sidewall of the upper sub-collector layer and the top surface of the bottom sub-collector layer are exposed. The method also includes forming a collector layer on the upper sub-collector layer. The method also includes forming a base layer on the collector layer. The method also includes forming an emitter layer on the base layer. The method also includes forming a collector electrode on the sidewall of the upper sub-collector layer and the top surface of the bottom sub-collector layer.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1E, 1F-1 are cross-sectional representations of various stages of forming a bipolar transistor in accordance with some embodiments.

FIG. 1F-2 is a cross-sectional representation of a bipolar transistor in accordance with some other embodiments.

FIG. 1F-3 is a cross-sectional representation of a bipolar transistor in accordance with some other embodiments.

FIG. 2 is a cross-sectional representation of a bipolar transistor in accordance with some other embodiments.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure.

Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a bipolar transistor. By forming a collector electrode on the sidewall of the sub-collector layer, the spacing between the collector layer and the collector electrode may be reduced and the collector resistance may be reduced. Moreover, an ohmic contact is formed between the collector electrode and the sub-collector layer. Therefore, the collector resistance is reduced further.

Figure 1A:
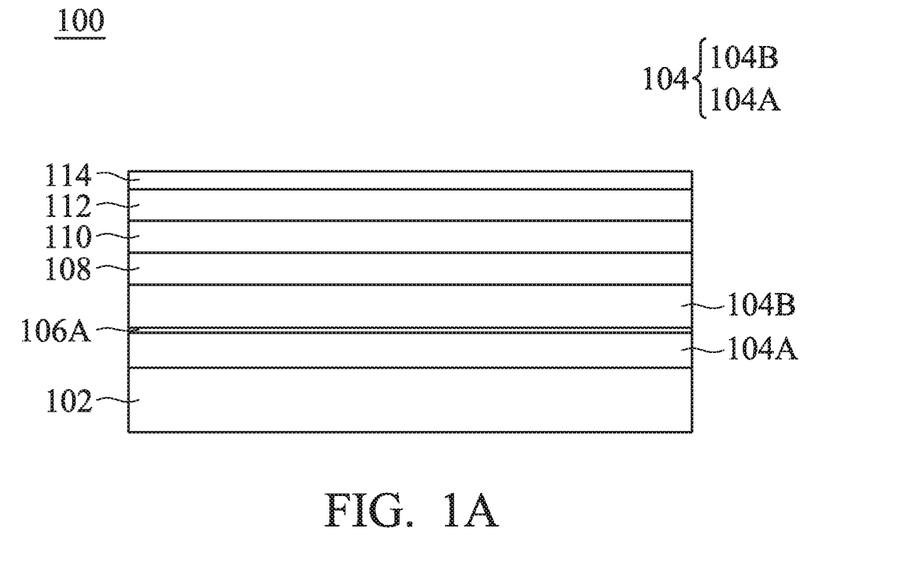

FIGS. 1A-1E, 1F-1 are cross-sectional representations of various stages of forming a bipolar transistor 100 in accordance with some embodiments. As shown in FIG. 1A, the bipolar transistor 100 includes a substrate 102. In some embodiments, the substrate 102 is a semiconductor substrate. Moreover, the substrate 102 may include III-V semiconductors such as GaN, AlGaN, AlN, GaAs, AlGaAs, InP, InAlAs, InGaAs, or a combination thereof. In some embodiments, the substrate 102 includes undoped GaAs.

Next, a bottom sub-collector layer 104A is formed on the substrate 102. In some embodiments, the bottom sub-collector layer 104A includes a III-V semiconductor having a first conductivity type. In some other embodiments, the bottom sub-collector layer 104A includes a III-V semiconductor having a second conductivity type. The second conductivity type is opposite to the first conductivity type. In some embodiments, the first conductivity type is N-type. The bottom sub-collector layer 104A may include III-V semiconductors such as GaN, AlGaN, AlN, GaAs, AlGaAs, InP, InAlAs, InGaAs, or a combination thereof. In some embodiments, the bottom sub-collector layer 104A is an n-type GaAs layer which may be doped by Si, Se, and Te. In some embodiments, the doping concentration of the bottom sub-collector layer 104A is in a range of between $1 \times 10^{18}$ cm$^{-3}$ to $1 \times 10^{20}$ cm$^{-3}$. In some embodiments, the doping concentration of the bottom sub-collector layer 104A is $5 \times 10^{18}$ cm$^{-3}$. With doping concentration of this order, it may be easier to form an ohmic contact between the bottom sub-collector layer 104A and subsequently formed collector electrode. If the doping concentration of the bottom sub-collector layer 104A is too high, the dopant may not be activated completely and the reliability may be worse. If the doping concentration of the bottom sub-collector layer 104A is too low, an ohmic contact may not be formed between the bottom sub-collector layer 104A and subsequently formed collector electrode. In some embodiments, the bottom sub-collector layer 104A may have a thickness of between 50 nm and 1500 nm. In some embodiments, the bottom sub-collector layer 104A has a thickness of between 100 nm and 1000 nm. In some embodiments, the bottom sub-collector layer 104A has a thickness of between 100 nm and 800 nm. If the bottom sub-collector layer 104A is too thick, it may be difficult for isolation by implantation. If the bottom sub-collector layer 104A is too thin, the collector resistance may increase. In some embodiments, the bottom sub-collector layer 104A is formed on the substrate 102 by molecular-beam epitaxy (MBE), metalorganic chemical vapor deposition (MOCVD), chemical vapor deposition (CVD), hydride vapor phase epitaxy (HVPE), another suitable method, or a combination thereof. The bottom sub-collector layer 104A may be doped by in-situ doping.

Next, a first etch stop layer 106A is optionally formed on the bottom sub-collector layer 104A. In some embodiments, the first etch stop layer 106A includes InGaP, InGaAs, GaAsP, AlGaAs, InAlAs, GaSb or a combination thereof. In some embodiments, the first etch stop layer 106A has a doping concentration in the same order with the doping concentration of the bottom sub-collector layer 104A. In other words, the doping concentration of the first etch stop layer 106A is in a range of between $1 \times 10^{18}$ cm$^{-3}$ to $1 \times 10^{20}$ cm$^{-3}$. If the doping concentration of the first etch stop layer 106A is too high, the dopant may not be activated completely and the reliability may be worse. If the doping concentration of the first etch stop layer 106A is too low, the collector resistance may increase. In some embodiments, the first etch stop layer 106A may have a thickness of between 5 nm and 200 nm. In some embodiments, the first etch stop layer 106A has thickness of between 5 nm and 50 nm. If the first etch stop layer 106A is too thick, the collector resistance may increase. If the first etch stop layer 106A is too thin, it may not be sufficient to make subsequent etching process stop. The first etch stop layer 106A may be formed by molecular-beam epitaxy (MBE), metalorganic chemical vapor deposition (MOCVD), chemical vapor deposition (CVD), hydride vapor phase epitaxy (HVPE), another suitable method, or a combination thereof. The first etch stop layer 106A may be doped by in-situ doping.

Next, an upper sub-collector layer 104B is formed on the first etch stop layer 106A (if existed) or the bottom sub-collector layer 104A. In some embodiments, the upper sub-collector layer 104B may have a thickness of between 50 nm and 1500 nm. In some embodiments, the upper sub-collector layer 104B has a thickness of between 100 nm and 1000 nm. In some embodiments, the upper sub-collector layer 104B has a thickness of between 100 nm and 800 nm. In some embodiments, the thickness of the upper sub-collector layer 104B and the thickness of the bottom sub-collector layer 104A are substantially the same. The thickness ratio of the upper sub-collector layer 104B to the bottom sub-collector layer 104A may determine the shape and location of the subsequently formed collector electrode, which will be described later. In some embodiments, the upper sub-collector layer 104B is in directly contact with the subsequently formed collector electrode. In some embodiments, the doping concentration of the upper sub-collector layer 104B is in a range of between $1 \times 10^{18}$ cm$^{-3}$ to $1 \times 10^{20}$ cm$^{-3}$. In some embodiments, the doping concentration of the upper sub-collector layer 104B is $5 \times 10^{18}$ cm$^{-3}$. With doping concentration of this order, it may be easier to form an ohmic contact between the upper sub-collector layer 104B and the subsequently formed collector electrode. If the doping concentration of the upper sub-collector layer 104B is too high, the dopant may not be activated completely and the reliability may be worse. If the doping concentration of the upper sub-collector layer 104B is too low, an ohmic contact may not be formed between the upper sub-collector layer 104B and subsequently formed collector electrode. In some embodiments, the doping concentrations of the upper sub-collector layer 104B and the bottom sub-collector layer 104A are the same. In some other embodiments, the dopant concentration of the upper sub-collector layer 104B and the bottom sub-collector layer 104A are different. As long as the dopant concentrations are high enough, ohmic contact may be formed between the upper sub-collector layer 104B, the bottom sub-collector layer 104A, and the subsequently formed collector electrode. Materials and processes used to form the upper sub-collector layer 104B may be similar to, or the same as, those used to form the bottom sub-collector layer 104A described previously and are not repeated herein for brevity.

It should be noted that since the first etch stop layer 106A is optionally formed, the upper sub-collector layer 104B and the bottom sub-collector layer 104A may be formed with a same material at the same time, which may save production cost and time. The upper sub-collector layer 104B and the bottom sub-collector layer 104A may be referred to as a sub-collector layer 104.

Next, a collector layer 108 is formed on the upper sub-collector layer 104B. In some embodiments, the collector layer 108 includes a III-V semiconductor having a first conductivity type. The collector layer 108 may include III-V semiconductors such as GaN, AlGaN, AlN, GaAs, AlGaAs, InP, InAlAs, InGaAs, GaSb, or a combination thereof. In some embodiments, the collector layer 108 is an n-type GaAs layer. The collector layer 108 may be formed by molecular-beam epitaxy (MBE), metalorganic chemical vapor deposition (MOCVD), chemical vapor deposition (CVD), hydride vapor phase epitaxy (HVPE), another suitable method, or a combination thereof. In some embodiments, the doping concentration of the collector layer 108 is in a range of between 0 $cm^{-3}$ to 1e18 $cm^{-3}$. In some embodiments, the doping concentration of the collector layer 108 is in a range of between 1e14 $cm^{-3}$ to 1e18 $cm^{-3}$. In some embodiments, the doping concentration of the collector layer 108 is in a range of between 1e14 $cm^{-3}$ to 1e17 $cm^{-3}$. In some embodiments, the doping concentration of the collector layer 108 is in a range of between 1e14 $cm^{-3}$ to 3e17 $cm^{-3}$. In some embodiments, the doping concentration of the collector layer 108 is in a range of between 1e14 $cm^{-3}$ to 5e17 $cm^{-3}$. In some embodiments, the doping concentration of the collector layer 108 is in a range of between 1e14 $cm^{-3}$ to 8e17 $cm^{-3}$. The collector layer 108 may be a multi-layer structure with different doping concentration. Since the doping concentration of the collector layer 108 is lower than the upper sub-collector layer 104B, if the subsequently formed collector electrode is in contact with the collector layer 108, a Schottky contact, not an ohmic contact, may be formed between the collector layer 108 and the subsequently formed collector electrode.

Next, a base layer 110 is formed on the collector layer 108. In some embodiments, the base layer 110 includes a III-V semiconductor having a second conductivity type. The base layer 110 may include III-V semiconductors such as GaN, AlGaN, AlN, GaAs, AlGaAs, InP, InAlAs, InGaAs, GaSb or a combination thereof. In some embodiments, the base layer 110 is a highly doped p-type GaAs layer which may be doped by C, Mg, Zn, Ca, Be, Sr, Ba, and Ra. The doping concentration of the base layer 110 may be in a range of between 1e18 $cm^{-3}$ to 1e20 $cm^{-3}$. The base layer 110 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Next, an emitter layer 112 is formed on the base layer 110. In some embodiments, the emitter layer 112 includes a III-V semiconductor having a first conductivity type. The emitter layer 112 may include III-V semiconductors such as GaN, AlGaN, AlN, GaAs, AlGaAs, InP, InAlAs, InGaAs, or a combination thereof. In some embodiments, the emitter layer 112 is an n-type InGaP layer. The emitter layer 112 may be a multi-layer structure. In some embodiments, the emitter layer 112 includes an n-type InGaP layer at the bottom and an n-type GaAs layer at the top (not shown.) In some embodiments, the material of the emitter layer 112 and the material of the base layer 110 are different materials with different band gaps. Therefore, a heterojunction may be formed at the interface between the emitter layer 112 and the base layer 110. The emitter layer 112 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Next, an emitter cap layer 114 is formed on the emitter layer 112. In some embodiments, the emitter cap layer 114 includes a III-V semiconductor having a first conductivity type. The emitter cap layer 114 may include III-V semiconductors such as GaN, AlGaN, AlN, GaAs, AlGaAs, InP, InAlAs, InGaAs, or a combination thereof. In some embodiments, the emitter cap layer 114 is a highly doped n-type InGaAs layer which may help to form ohmic contact between the emitter cap layer 114 and the subsequently formed emitter electrode. The emitter cap layer 114 may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Figure 1B:
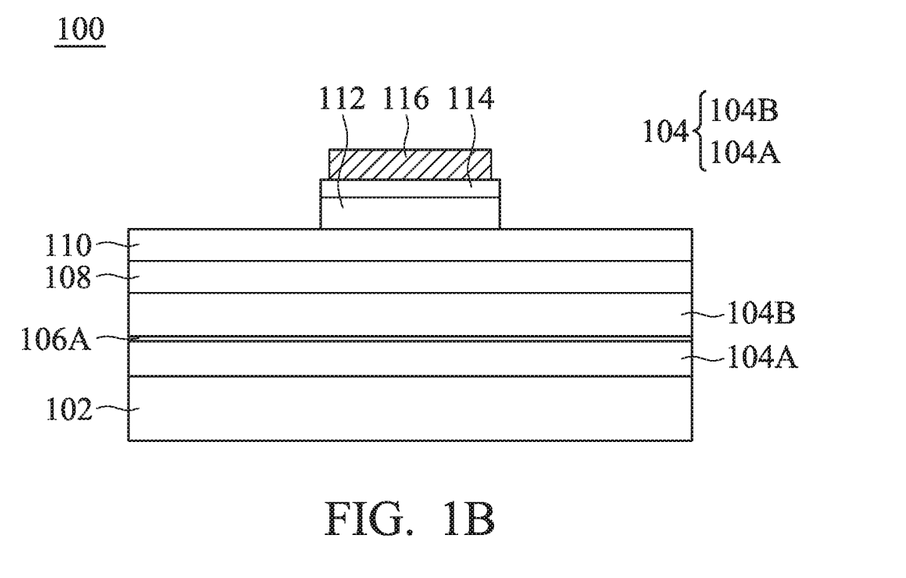

Next, as shown in FIG. 1B, an emitter electrode 116 is formed on the emitter cap layer 114. The emitter electrode 116 may include Ti, Al, Au, Pd, Pt, Cu, W, other suitable metal, its alloy, or a combination thereof. An emitter electrode material may be formed on the emitter cap layer 114 first by electroplating, sputtering, resistive heating evaporation, physical vapor deposition (PVD), chemical vapor deposition (CVD), atomic layer deposition (ALD), another suitable method, or a combination thereof. The electrode material is then patterned by a photolithography and an etching process, and the emitter electrode 116 is formed.

After the emitter electrode 116 is formed, the emitter cap layer 114 and the emitter layer 112 are then patterned by a photolithography and an etching process. The patterning process may include photoresist coating (such as spin-on coating), soft baking, mask aligning, pattern exposure, post-exposure baking, photoresist development, rinsing and drying (such as hard baking), other suitable techniques, or a combination thereof. The etching process may include a dry etching process (such as reactive ion etching (RIE) or an anisotropic plasma etching method), wet etching, or a combination thereof. As a result, a mesa of the emitter cap layer 114 and the emitter layer 112 is formed.

Figure 1C:
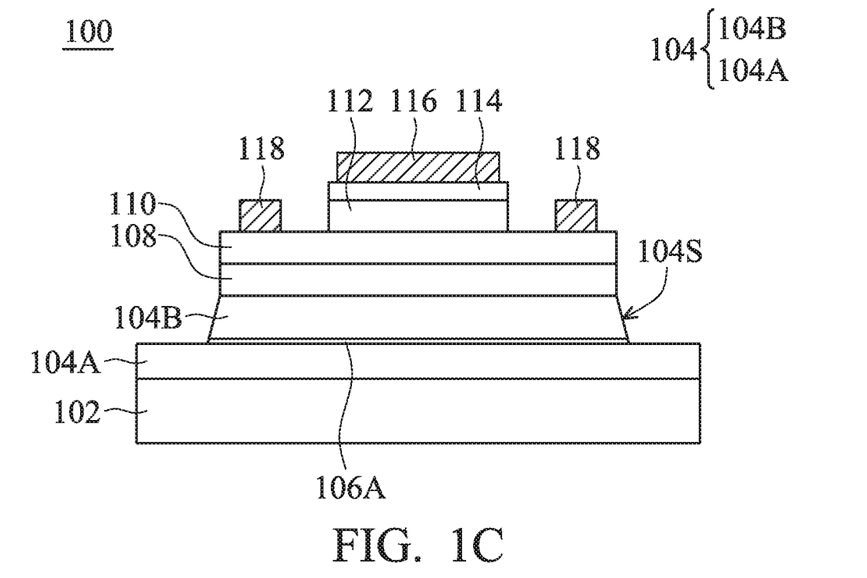

Next, as shown in FIG. 1C, the base layer 110, the collector layer 108, the upper sub-collector layer 104B are patterned by a photolithography and an etching process to form a mesa of the base layer 110, the collector layer 108, and the upper sub-collector layer 104B. As shown in FIG. 1C, the etching stops at the first etch stop layer 106A. Therefore, the first etch stop layer 106A may protect the bottom sub-collector layer 104A from being over-etched, resulting in a uniform thickness of the bottom sub-collector layer 104A.

The etching of the base layer 110 and the collector layer 108 and the etching of the upper sub-collector layer 104B may be different. For example, the etching of the base layer 110 and the collector layer 108 may be an anisotropic process such as a dry etching process. The dry etching process may be performed by an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), bromine-containing gas (such as HBr and/or $CHBR_3$), iodine-containing gas, other suitable gas and/or plasma, or a combination thereof. Therefore, the base layer 110 and the collector layer 108 may have a sidewall perpendicular to the bottom surface of the collector layer 108. On the other hand, the etching of the upper sub-collector layer 104B may be an isotropic process such as a wet etching process. The wet etching process may be performed in wet etching etchant including diluted hydrofluoric acid (DHF), potassium hydroxide (KOH), ammonia, hydrofluoric acid (HF), nitric acid ($HNO_3$), and/or acetic acid ($CH_3COOH$), other suitable wet etching etchant, or a combination thereof. Therefore, as shown in FIG. 1C, the upper sub-collector layer 104B may have a tapered sidewall 104S which is not perpendicular to the bottom surface of the upper sub-collector layer 104B.

It should be noted that the shape of the upper sub-collector layer 104B is merely an example and the upper sub-collector layer 104B in the present embodiment is not limited thereto. The etching of the upper sub-collector layer 104B may also be an anisotropic process and therefore the upper sub-collector layer 104B may have a straight sidewall 104S.

Next, as shown in FIG. 1C, base electrodes 118 are formed on the top surface of the base layer 110. The processes for forming the base electrodes 118 may be the same as, or similar to, those used to form the emitter electrode 116. For the purpose of brevity, the descriptions of these processes are not repeated herein.

Figure 1D:
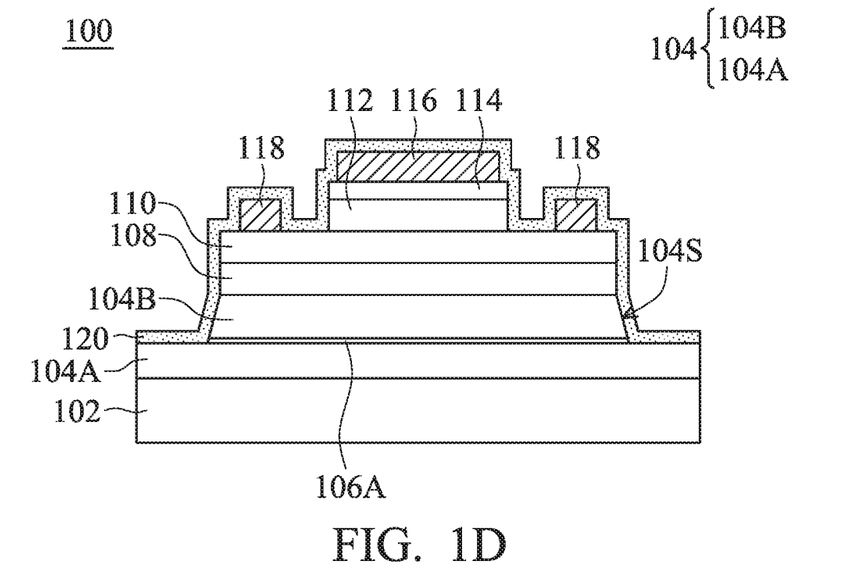

Next, as shown in FIG. 1D, a passivation layer 120 is formed covering the bottom sub-collector layer 104A, the upper sub-collector layer 104B, the collector layer 108, the base layer 110, the emitter layer 112, and the emitter cap layer 114. The passivation layer 120 may include $SiN_3$, $SiO_2$, SiON, $Al_2O_3$, AlN, polyimide (PI), benzocyclobutene (BCB), or polybenzoxazole (PBO), other insulating materials, or a combination thereof. In some embodiments, the passivation layer 120 includes $SiN_3$. The passivation layer 120 may be formed by metalorganic chemical vapor deposition (MOCVD), chemical vapor deposition (CVD), spin-coating, another suitable method, or a combination thereof. In some embodiments, the passivation layer 120 is conformally formed on the bottom sub-collector layer 104A, the upper sub-collector layer 104B, the collector layer 108, the base layer 110, the emitter layer 112, and the emitter cap layer 114. The passivation layer 120 may protect the layers below, and provide physical isolation and structure support.

Figure 1E:
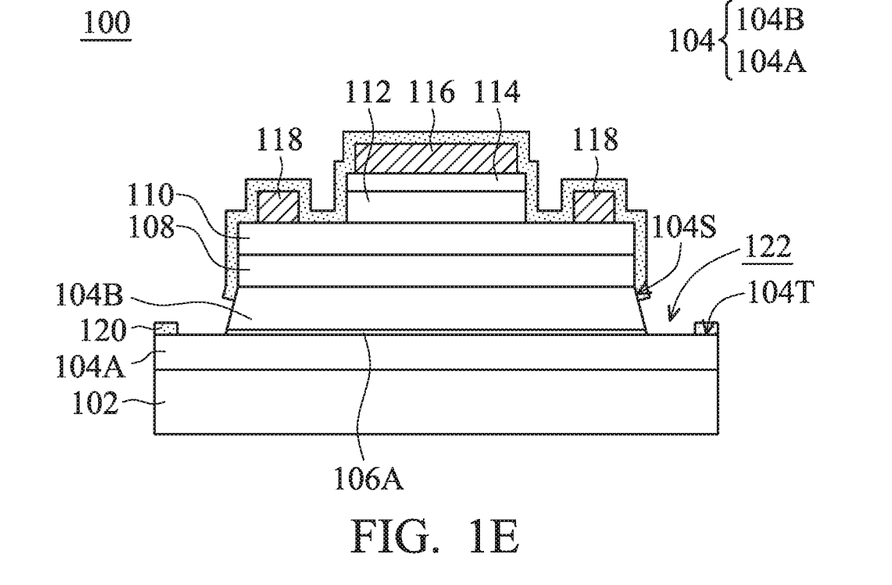

Next, as shown in FIG. 1E, openings 122 is formed in the passivation layer 120 exposing a portion of the sidewall 104S of the upper sub-collector layer 104B and the top surface 104T of the bottom sub-collector layer 104A. The openings 122 may be formed in the passivation layer 120 by a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

Next, as shown in FIG. 1F-1, collector electrodes 124 are formed in the openings 122. The collector electrodes 124 may include conductive material such as Ti, Al, Au, Pd, Pt, Cu, W, other suitable metal, its alloy, or a combination thereof. The processes for forming the collector electrodes 124 may be the same as, or similar to, those used to form the emitter electrode 116. For the purpose of brevity, the descriptions of these processes are not repeated herein. Since the openings 122 exposes the sidewall 104S of the upper sub-collector layer 104B and the top surface 104T of the bottom sub-collector layer 104A, the collector electrodes 124 is directly on the sidewall 104S of the upper sub-collector layer 104B and the top surface 104T of the bottom sub-collector layer 104A. The collector electrode 124 may have a flat bottom surface over the bottom sub-collector layer 104A.

Figure 1F:
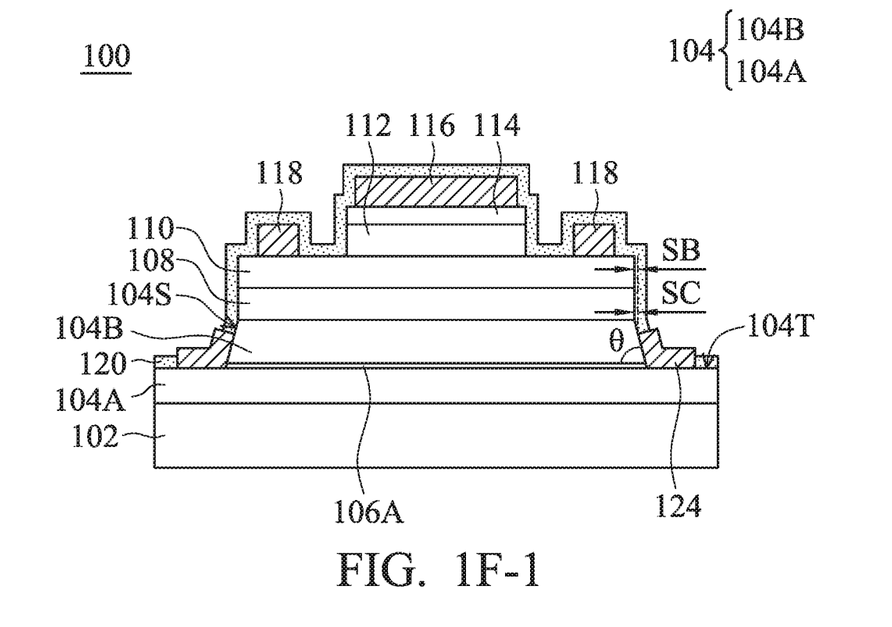

As described above, the upper sub-collector layer 104B and the bottom sub-collector layer 104A may be highly doped with a doping concentration of in a range of between $1\times10^{18}$ $cm^{-3}$ to $1\times10^{20}$ $cm^{-3}$. Therefore, an ohmic contact may be formed between the collector electrodes 124 and the upper sub-collector layer 104B. In addition, an ohmic contact may also be formed between the collector electrodes 124 and the bottom sub-collector layer 104A. With such a large ohmic contact area, the collector resistance may be reduced.

As shown in FIG. 1F-1, the minimum distance SC between the collector layer 108 and the collector electrode 124 may be in a range of 0 μm to 1 μm. In some embodiments, the minimum distance SC between the collector layer 108 and the collector electrode 124 is in a range of 0 μm to 0.5 μm. In some embodiments, the minimum distance SC between the collector layer 108 and the collector electrode 124 is in a range of 0.1 μm to 0.3 μm. In some embodiments, the minimum distance SC between the collector layer 108 and the collector electrode 124 is in a range of 0.2 μm to 0.3 μm. In some embodiments, the minimum distance SC between the collector layer 108 and the collector electrode 124 is in a range of 0.1 μm to 0.4 μm. In some embodiments, the minimum distance SC between the collector layer 108 and the collector electrode 124 is in a range of 0 μm to 0.4 μm. In some embodiments, the minimum distance SC between the collector layer 108 and the collector electrode 124 is in a range of 0 μm to 0.3 μm. If the minimum distance SC between the collector layer 108 and the collector electrode 124 is too long, the collector resistance may increase. If the minimum distance SC between the collector layer 108 and the collector electrode 124 is too short, the collector layer 108 and the collector electrode 124 may short-circuit or a Schottky contact, not an ohmic contact, between the collector layer 108 and the collector electrode 124 may be formed.

As shown in FIG. 1F-1, the minimum distance SB between the base layer 110 and the collector electrode 124 may be in a range of 0 μm to 1 μm. In some embodiments, the minimum distance SB between the base layer 110 and the collector electrode 124 is in a range of 0 to 0.5 μm. In some embodiments, the minimum distance SB between the base layer 110 and the collector electrode 124 is in a range of 0.1 μm to 0.3 μm. In some embodiments, the minimum distance SB between the base layer 110 and the collector electrode 124 is in a range of 0.2 μm to 0.3 μm. In some embodiments, the minimum distance SB between the base layer 110 and the collector electrode 124 is in a range of 0.1 μm to 0.4 μm. In some embodiments, the minimum distance SB between the base layer 110 and the collector electrode 124 is in a range of 0 μm to 0.4 μm. In some embodiments, the minimum distance SB between the base layer 110 and the collector electrode 124 is in a range of 0 μm to 0.3 μm. If the minimum distance SB between the base layer 110 and the collector electrode 124 is too long, the collector resistance may increase. If the minimum distance SB between the base layer 110 and the collector electrode 124 is too short, the base layer 110 and the collector electrode 124 may short-circuit.

It should be noted that since the minimum distance SB between the base layer 110 and the collector electrode 124 is close, the passivation layer 120 may be formed before forming the collector electrode 124. Therefore, the bottom sub-collector layer 104A, the upper sub-collector layer 104B, the collector layer 108, the base layer 110, the emitter layer 112, and the emitter cap layer 114 under the passivation layer 120 may be protected and unwanted short-circuits may be avoided.

As shown in FIG. 1F-1, the angle θ between a sidewall of the upper sub-collector layer 104B and a bottom surface of the upper sub-collector layer 104B may be less than 90 degrees. In some embodiments, the angle θ between a sidewall of the upper sub-collector layer 104B and a bottom surface of the upper sub-collector layer 104B may be in a range of 20 degrees to 89 degrees. In some embodiments, the angle θ between a sidewall of the upper sub-collector layer 104B and a bottom surface of the upper sub-collector layer 104B may be in a range of 30 degrees to 80 degrees. In some embodiments, the angle θ between a sidewall of the upper sub-collector layer 104B and a bottom surface of the upper sub-collector layer 104B may be in a range of 30 degrees to 70 degrees. In some embodiments, the angle θ between a sidewall of the upper sub-collector layer 104B and a bottom surface of the upper sub-collector layer 104B may be in a range of 20 degrees to 80 degrees. If the angle θ is too small, the collector electrode 124 may be far away from the base and the collector resistance may increase. If the angle θ is too large, it may be not easy to form the collector electrode 124 on the sidewall of the upper sub-collector layer 104B.

In some embodiments as shown in FIG. 1F-1, a thickness of the collector electrode 124 on the sidewall 104S of the upper sub-collector layer 104B and a thickness of the collector electrode 124 on the top surface 104T of the bottom sub-collector layer 104A are substantially the same. It should be noted that although the shape of the collector electrode 124 is conformal on the sidewall 104S of the upper sub-collector layer 104B and the top surface 104T of the bottom sub-collector layer 104A, the shape of the collector electrode 124 is not limited thereto. The collector electrode 124 may be in any shape, depending on the demands of the collector resistance.

It should be noted that as shown in FIG. 1F-1, the sidewall of the collector layer 108 and the sidewall of the base layer 110 are aligned, so the minimum distance SC between the collector layer 108 and the collector electrode 124 and the minimum distance SB between the base layer 110 and the collector electrode 124 are the same. However, the profile of the mesa of the base layer 110, the collector layer 108, and the upper sub-collector layer 104B is not limited thereto. By forming the collector electrode 124 on the sidewall 104S of the upper sub-collector layer 104B, the minimum distance SC between the collector layer 108 and the collector electrode 124 may be reduced, and the collector resistance may also be reduced. Moreover, since the upper sub-collector layer 104B and the bottom sub-collector layer 104A may be highly doped, an ohmic contact may be formed between the upper sub-collector layer 104B and the collector electrode 124. An ohmic contact may also be formed between the bottom sub-collector layer 104A and the collector electrode 124. The enlarged ohmic contact area may further reduce the collector resistance.

Figure 1F:
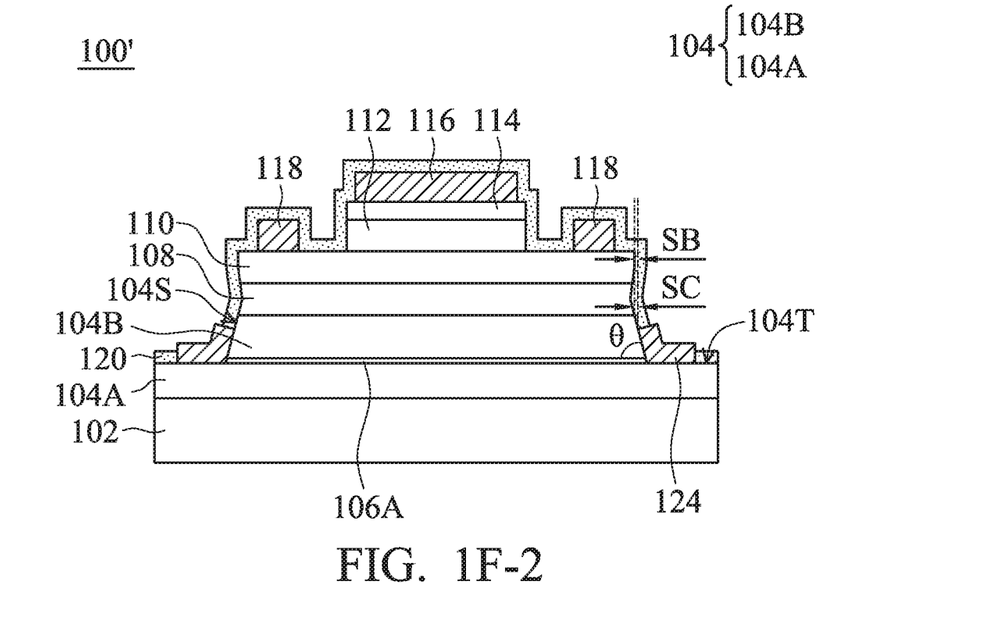

Many variations and/or modifications may be made to the embodiments of the disclosure. FIG. 1F-2 is a cross-sectional representation of a bipolar transistor 100' in accordance with some other embodiments. Some processes or devices are the same as, or similar to, those described in the embodiments above, and therefore the descriptions of these processes and devices are not repeated herein. The difference from the embodiments described above is that, as shown in FIG. 1F-2 in accordance with some other embodiments, the collector layer 108 is etched laterally.

As shown in FIG. 1F-2, when forming a mesa of the base layer 110, the collector layer 108, and the upper sub-collector layer 104B, a dry etching process is performed first and then a wet etching process is performed. Therefore, the collector layer 108 is etched laterally. In some embodiments, the minimum distance SC between the collector layer 108 and the collector electrode 124 and the minimum distance SB between the base layer 110 and the collector electrode 124 are the same. In some embodiments, the minimum distance SC between the collector layer 108 and the collector electrode 124 and the minimum distance SB between the base layer 110 and the collector electrode 124 are the same as in the embodiment shown in FIG. 1F-1.

By forming the collector electrode 124 on the sidewall 104S of the upper sub-collector layer 104B, the minimum distance SC between the collector layer 108 and the collector electrode 124 may be reduced, and the collector resistance may also be reduced. Moreover, since the upper sub-collector layer 104B and the bottom sub-collector layer 104A may be highly doped, an ohmic contact may be formed between the upper sub-collector layer 104B and the collector electrode 124. An ohmic contact may also be formed between the bottom sub-collector layer 104A and the collector electrode 124. The enlarged ohmic contact area may further reduce the collector resistance. The collector layer 108 may be etched laterally due to different etching process of forming the mesa of the base layer 110, the collector layer 108, and the upper sub-collector layer 104B.

Figure 1F:
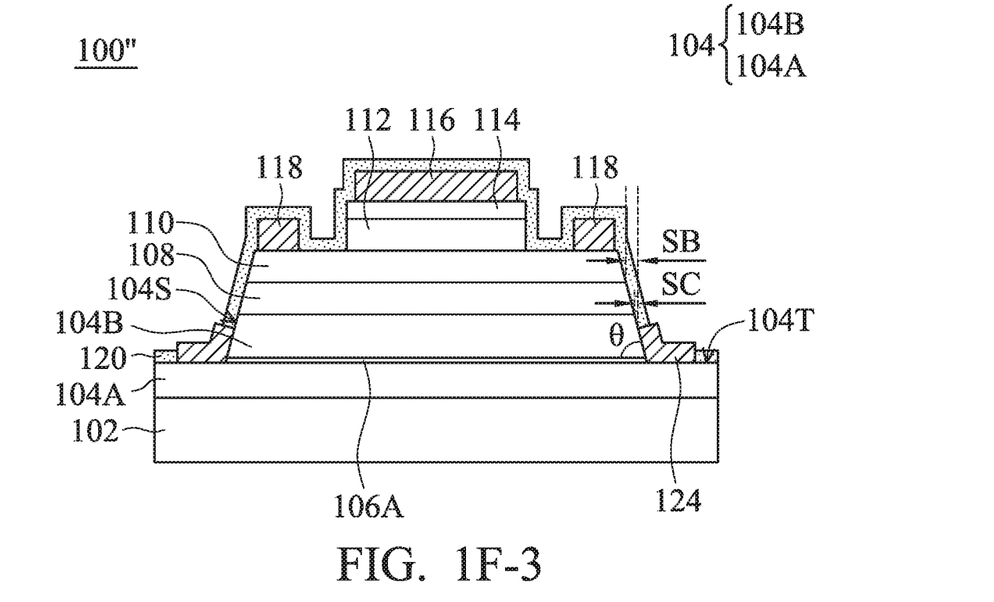

Many variations and/or modifications may be made to the embodiments of the disclosure. FIG. 1F-3 is a cross-sectional representation of a bipolar transistor 100" in accordance with some other embodiments. Some processes or devices are the same as, or similar to, those described in the embodiments above, and therefore the descriptions of these processes and devices are not repeated herein. The difference from the embodiments described above is that, as shown in FIG. 1F-3 in accordance with some other embodiments, both of the base layer 110 and the collector layer 108 have tapered sidewalls.

As shown in FIG. 1F-3, a wet etching process is performed when forming a mesa of the base layer 110, the collector layer 108, and the upper sub-collector layer 104B. Therefore, the base layer 110 and the collector layer 108 have tapered sidewalls relative to the bottom surface of the upper sub-collector layer 104B.

Therefore, the minimum distance SC between the collector layer 108 and the collector electrode 124 may be smaller than the minimum distance SB between the base layer 110 and the collector electrode 124. The minimum distance SC between the collector layer 108 and the collector electrode 124 and the minimum distance SB between the base layer 110 and the collector electrode 124 may be the same as in the embodiment shown in FIG. 1F-1.

By forming the collector electrode 124 on the sidewall 104S of the upper sub-collector layer 104B, the minimum distance SC between the collector layer 108 and the collector electrode 124 may be reduced, and the collector resistance may also be reduced. Moreover, since the upper sub-collector layer 104B and the bottom sub-collector layer 104A may be highly doped, an ohmic contact may be formed between the upper sub-collector layer 104B and the collector electrode 124. An ohmic contact may also be formed between the bottom sub-collector layer 104A and the collector electrode 124. The enlarged ohmic contact area may further reduce the collector resistance. Both of the base layer 110 and the collector layer 108 have tapered sidewalls due to different etching process of forming the mesa of the base layer 110, the collector layer 108, and the upper sub-collector layer 104B.

Figure 2:
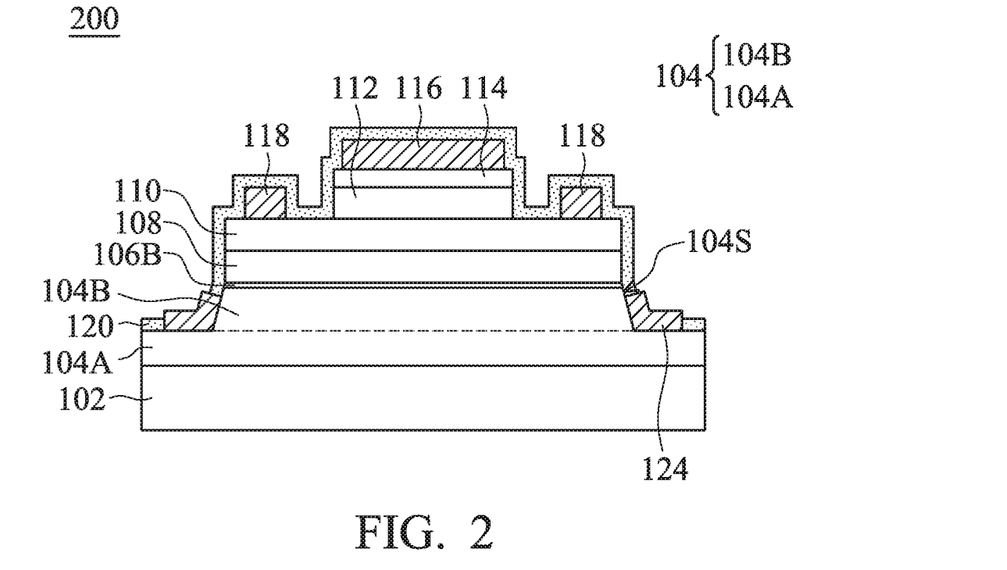

Many variations and/or modifications may be made to the embodiments of the disclosure. FIG. 2 is a cross-sectional representation of a bipolar transistor 200 in accordance with some other embodiments. Some processes or devices are the same as, or similar to, those described in the embodiments above, and therefore the descriptions of these processes and devices are not repeated herein. The difference from the embodiments described above is that, as shown in FIG. 2, a second etch stop layer 106B is optionally formed on the upper sub-collector layer 104B.

As shown in FIG. 2, when forming a mesa of the base layer 110, the collector layer 108, the upper sub-collector layer 104B, the base layer 110 and the collector layer 108 are etched first and the etching stops at the second etch stop layer 106B. Therefore, the second etch stop layer 106B may protect the upper sub-collector layer 104B from being over-etched, resulting in a uniform thickness of the upper sub-collector layer 104B.

Materials and processes used to form the second etch stop layer 106B may be similar to, or the same as, those used to form the first etch stop layer 106A described previously and are not repeated herein for brevity.

In the case without the first etch stop layer 106A, the upper sub-collector layer 104B and the bottom sub-collector layer 104A are made of a single III-V semiconductor having a first conductivity type. Since the upper sub-collector layer 104B and the bottom sub-collector layer 104A are formed at the same time, the production cost and time may be saved. The upper sub-collector layer 104B and the bottom sub-collector layer 104A may be referred to as a sub-collector layer 104. There is no obvious interface between them and therefore the interface is shown by a dashed line.

It should be noted that, although not shown in FIG. 2, the first etch stop layer 106A may also be formed between the upper sub-collector layer 104B and the bottom sub-collector layer 104A. With the first etch stop layer 106A and the second etch stop layer 106B, the thickness of the bottom sub-collector layer 104A and the upper sub-collector layer 104B may be uniform.

In the embodiments shown in FIG. 2, by forming the collector electrode 124 on the sidewall 104S of the upper sub-collector layer 104B, the minimum distance between the collector layer 108 and the collector electrode 124 may be reduced, and the collector resistance may also be reduced. Moreover, since the upper sub-collector layer 104B and the bottom sub-collector layer 104A may be highly doped, an ohmic contact may be formed between the sub-collector layer 104 and the collector electrode 124. The enlarged ohmic contact area may further reduce the collector resistance. Furthermore, forming the second etch stop layer 106B may help to improve the uniformity since the thickness of the upper sub-collector layer 104B is uniform.

Figure 3:
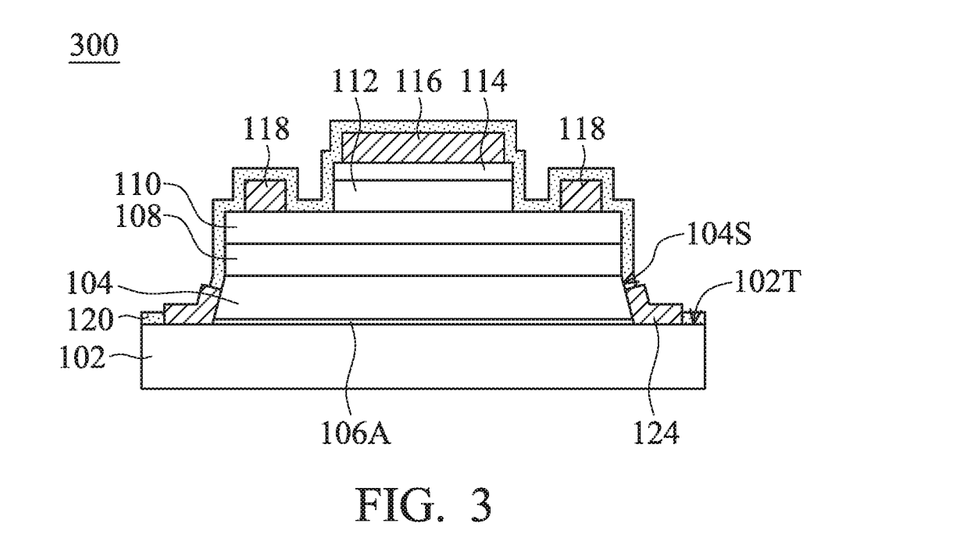
FIG. 3 is a cross-sectional representation of a bipolar transistor in accordance with some further embodiments.

Many variations and/or modifications may be made to the embodiments of the disclosure. FIG. 3 is a cross-sectional representation of a bipolar transistor 300 in accordance with some other embodiments. Some processes or devices are the same as, or similar to, those described in the embodiments above, and therefore the descriptions of these processes and devices are not repeated herein. The difference from the embodiments described above is that, as shown in FIG. 3, the sub-collector layer 104 is directly formed on the substrate 102, and the collector electrode 124 is in direct contact with the sidewall 104S of the sub-collector layer 104 and the top surface 102T of the substrate 102.

As shown in FIG. 3, the first etch stop layer 106A is optionally formed on the substrate 102, and the sub-collector layer 104 is formed on the first etch stop layer 106A (if existed). Since only a single sub-collector layer 104 is formed, the production time and cost may be saved.

In the embodiments shown in FIG. 3, by forming the collector electrode 124 on the sidewall 104S of the sub-collector layer 104, the minimum distance between the collector layer 108 and the collector electrode 124 may be reduced, and the collector resistance may also be reduced. Moreover, since the sub-collector layer 104 may be highly doped, an ohmic contact may be formed between the sub-collector layer 104 and the collector electrode 124, which may further reduce the collector resistance. Furthermore, forming a single sub-collector layer 104 on the substrate 102 may also save the production time and cost.

As mentioned above, in the present disclosure, a bipolar transistor and a method of forming a bipolar transistor is provided. With a highly doped sub-collector layer, an ohmic contact may be formed between the collector electrode and the sub-collector layer. With collector electrode forming on the sidewall of the sub-collector layer, the distance between the collector electrode and the collector layer may be reduced, which may further reduce the collector resistance. With an etch stop layer inside or on the sub-collector layer, the uniformity of the sub-collector layer may be improved. The collector electrode may also be formed directly on the substrate to save production time and cost.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bipolar transistor, comprising:
   an upper sub-collector layer;
   a collector layer disposed on the upper sub-collector layer;
   a base layer disposed on the collector layer;
   an emitter layer disposed on the base layer; and
   a collector electrode disposed directly on a sidewall of the upper sub-collector layer,
   wherein a top portion of the collector electrode is lower than a top surface of the upper sub-collector layer, and the collector electrode only partially covers the sidewall of the upper sub-collector layer.

2. The bipolar transistor as claimed in claim 1, further comprising:
   a bottom sub-collector layer disposed beneath the upper sub-collector layer, wherein the collector electrode is disposed directly on a top surface of the bottom sub-collector layer.

3. The bipolar transistor as claimed in claim 1, further comprising:
   an etch stop layer disposed beneath the collector layer.

4. The bipolar transistor as claimed in claim 3, wherein the etch stop layer is disposed beneath the upper sub-collector layer.

5. The bipolar transistor as claimed in claim 1, wherein a doping concentration of the upper sub-collector layer is in a range of $1\times10^{18}$ cm$^{-3}$ to $1\times10^{20}$ cm$^{-3}$.

6. The bipolar transistor as claimed in claim 1, wherein a minimum distance between the collector layer and the collector electrode is in a range of 0 μm to 0.5 μm.

7. The bipolar transistor as claimed in claim 1, wherein an angle between the sidewall of the upper sub-collector layer and a bottom surface of the upper sub-collector layer is in a range of 20 degrees to 89 degrees.

8. A bipolar transistor, comprising:
a sub-collector layer disposed on a substrate;
a collector layer disposed on the sub-collector layer;
a base layer disposed on the collector layer;
an emitter layer disposed on the base layer;
a passivation layer covering an upper portion of a sidewall of the sub-collector layer and exposing a lower portion of the sidewall of the sub-collector layer; and
a collector electrode disposed on the sidewall of the sub-collector layer, wherein an ohmic contact is formed between the collector electrode and the sub-collector layer.

9. The bipolar transistor as claimed in claim 8, further comprising:
a first etch stop layer inside the sub-collector layer.

10. The bipolar transistor as claimed in claim 9, wherein a thickness of the sub-collector layer above the first etch stop layer and a thickness of the sub-collector layer beneath the first etch stop layer are substantially the same.

11. The bipolar transistor as claimed in claim 9, wherein the first etch stop layer comprises InGaP, InGaAs, GaAsP, AlGaAs, InAlAs, GaSb or a combination thereof.

12. The bipolar transistor as claimed in claim 9, wherein a doping concentration of the first etch stop layer and a doping concentration of the sub-collector layer are in the same order.

13. The bipolar transistor as claimed in claim 8, further comprising:
a second etch stop layer disposed between the sub-collector layer and the collector layer.

14. The bipolar transistor as claimed in claim 8, wherein a thickness of the collector electrode on the sidewall of the sub-collector layer and a thickness of the collector electrode on a top surface of the sub-collector layer are substantially the same.

15. A method for forming a bipolar transistor, comprising:
forming a bottom sub-collector layer on a substrate;
forming an upper sub-collector layer on the bottom sub-collector layer, wherein a sidewall of the upper sub-collector layer and a top surface of the bottom sub-collector layer are exposed;
forming a collector layer on the upper sub-collector layer;
forming a base layer on the collector layer;
forming an emitter layer on the base layer;
forming a passivation layer over the bottom sub-collector layer, the upper sub-collector layer, and the collector layer, wherein the passivation layer covers an upper portion of the sidewall of the upper sub-collector layer, and the passivation layer has an opening, the opening exposes a lower portion of the sidewall of the upper sub-collector layer; and
forming a collector electrode on the sidewall of the upper sub-collector layer and the top surface of the bottom sub-collector layer, and the collector electrode electrically connects to the upper sub-collector layer and the bottom sub-collector layer through the opening.

16. The method for forming a bipolar transistor as claimed in claim 15, further comprising:
forming a first etch stop layer over the bottom sub-collector layer, wherein the upper sub-collector layer is formed over the first etch stop layer.

17. The method for forming a bipolar transistor as claimed in claim 16, wherein a doping concentration of the first etch stop layer is in a range of $1\times10^{18}$ cm$^{-3}$ to $1\times10^{20}$ cm$^{-3}$.

18. The method for forming a bipolar transistor as claimed in claim 15, further comprising:
forming a second etch stop layer on the upper sub-collector layer.

19. The method for forming a bipolar transistor as claimed in claim 15,
wherein the passivation layer covers the base layer and the emitter layer.

20. The method for forming a bipolar transistor as claimed in claim 19, wherein forming the collector electrode comprises:
filling the opening with a conductive material.

* * * * *